United States Patent
Reiss et al.

(10) Patent No.: US 9,654,869 B2
(45) Date of Patent: May 16, 2017

(54) SYSTEM AND METHOD FOR AUTONOMOUS MULTI-TRACK AUDIO PROCESSING

(71) Applicant: MixGenius Inc., Montreal (CA)

(72) Inventors: Joshua D. Reiss, London (GB); Stuart Mansbridge, Penrith (GB); Alice Clifford, Stapleford (GB); Zheng Ma, London (GB); Sina Hafezi, London (GB); Nicholas Jillings, Dorking (GB)

(73) Assignee: LANDR AUDIO INC., Montreal, QC (CA)

( * ) Notice: Subject to any disclaimer, the term of this patent is extended or adjusted under 35 U.S.C. 154(b) by 156 days.

(21) Appl. No.: 14/398,990

(22) PCT Filed: May 7, 2013

(86) PCT No.: PCT/GB2013/051184
§ 371 (c)(1),
(2) Date: Nov. 5, 2014

(87) PCT Pub. No.: WO2013/167884
PCT Pub. Date: Nov. 14, 2013

(65) Prior Publication Data
US 2015/0117685 A1 Apr. 30, 2015

(30) Foreign Application Priority Data

May 8, 2012 (GB) .................................. 1208012.3

(51) Int. Cl.
*H04R 5/02* (2006.01)
*H04R 3/00* (2006.01)
(Continued)

(52) U.S. Cl.
CPC ............. *H04R 3/00* (2013.01); *G11B 27/031* (2013.01); *H03G 3/32* (2013.01); *H04R 5/04* (2013.01)

(58) Field of Classification Search
CPC .......... G11B 27/031; H04R 3/00; H04R 5/04; H03G 3/32
(Continued)

(56) References Cited

U.S. PATENT DOCUMENTS 5,414,776 A * 5/1995 Sims, Jr. ................ H04H 60/04
379/202.01
7,825,322 B1 11/2010 Classen et al.
(Continued)

FOREIGN PATENT DOCUMENTS

GB 2500790 A 10/2013
WO 2011/034520 A1 3/2011

OTHER PUBLICATIONS

Daniele Barchiesi et al: "Automatic Target Mixing Using Least-Squares Optimization of Gains and Equalization Settings", Proc. of the 12th Int. Conference on Digital Audio Effects (DAFx-09), Como, Italy, Sep. 1-4, 2009 (Sep. 1, 2009 to Sep. 4, 2009), pp. 1-8.
(Continued)

Primary Examiner — Paul S Kim (57) ABSTRACT

A method, apparatus, and computer readable medium for mixing a plurality of audio signals within an audio mixing system are disclosed. The method comprises receiving a plurality of audio signals, extracting at least one audio feature from each of the plurality of audio signals, determining, for each of the audio signals, an associated processing control function in accordance with a plurality of the extracted audio features, processing each audio signal in accordance with each associated processing control function, and outputting the plurality of processed audio signals.

30 Claims, 4 Drawing Sheets

(51) Int. Cl.
  G11B 27/031 (2006.01)
  H03G 3/32 (2006.01)
  H04R 5/04 (2006.01)
(58) Field of Classification Search
  USPC .................................................. 381/300, 123
  See application file for complete search history.

(56) References Cited

U.S. PATENT DOCUMENTS

| | | | | |
|---|---|---|---|---|
| 2002/0172376 | A1* | 11/2002 | Bizjak | H03G 3/3089 381/106 |
| 2009/0049979 | A1 | 2/2009 | Naik et al. | |
| 2012/0130516 | A1 | 5/2012 | Kellett et al. | |

OTHER PUBLICATIONS

Alice Clifford et al: "Calculating time delays of multiple active sources in live sound", Audio Engineering Society, Convention Paper 8157, Presented at the AES 129th Convention, San Francisco, United States of America, Nov. 4-7, 2010 (Nov. 4, 2010 to Nov. 7, 2010), pp. 1-8.
Enrique Perez Gonzalez et al.: "A Real-Time Semiautonomous Audio Panning System for Music Mixing", EURASIP Journal on Advances in Signal Processing, Apr. 23, 2010 (Apr. 23, 2010), pp. 1-10, vol. 2010, Article ID 436895,Hindawi Publishing Corporation.
Enrique Perez Gonzalez et al.: "An automatic maximum gain normalization technique with applications to audio mixing", Audio Engineering Society, Convention Paper, Presented at the AES 124th Convention, Amsterdam, The Netherlands, May 17-20, 2008 (May 17, 2008 to May 20, 2008), pp. 1-8.
Enrique Perez Gonzalez et al.: "Automatic equalization of multi-channel audio using cross-adaptive methods", Audio Engineering Society, Convention Paper, Presented at the AES 127th Convention, New York, United States of America, Oct. 9-12, 2009 (Oct. 9, 2009 to Oct. 12, 2009), pp. 1-6.
Enrique Perez Gonzalez et al.: "Automatic Gain and Fader Control for Live Mixing", Application of Signal Processing to Audio and Acoustics, 2009 IEEE Workshop, New Paltz, United States of America, Oct. 18-21, 2009 (Oct. 18, 2009 to Oct. 21, 2009), pp. 1-4.
Enrique Perez Gonzalez et al.: "Authomatic Mixing: Live Downmixing Stereo Panner", Proc. of the 10th Int. Conference on Digital Audio Effects (DAFx-07), Bordeaux, France, Sep. 10-15, 2007 (Sep. 10, 2007 to Sep. 15, 2007), pp. 1-6.
Enrique Perez Gonzalez et al.: "Determination and correction of individual channel time offsets for signals involved in an audio mixture", Audio Engineering Society, Convention Paper, Presented at the AES 125th Convention, San Francisco, United States of America, Oct. 2-5, 2008 (Oct. 2, 2008 to Oct. 5, 2008), pp. 1-10.
Enrique Perez Gonzalez et al.: "Improved Control for Selective Minimzation of Masking using Inter-Channel Dependancy Effects", Proc. of the 11th Int. Conference on Digital Audio Effects (DAFx-08), Espoo, Finland, Sep. 1-4, 2008 (Sep. 1, 2008 to Sep. 4, 2008), pp. 1-7.
Stuart Mansbridge et al.: "Implementation and Evaluation of Autonomous Multi-track Fader Control", Audio Engineering Society, Convention Paper 8588, Presented at the AES 132nd Convention, Budapest, Hungary, Apr. 26-29, 2012 (Apr. 26, 2012 to Apr. 29, 2012), pp. 1-11.
Martin J. Morrell et al.: "Dynamic Panner: An Adaptive Digital Audio Effect for Spatial Audio", Audio Engineering Society, Convention Paper, Presented at the AES 127th Convention, New York, United States of America, Oct. 9-12, 2009 (Oct. 9, 2009 to Oct. 12, 2009), pp. 1-20.
Joshua D. Reiss: "Intelligent Systems for Mixing Multichannel Audio", Proc. of the 17th Int. Conference on Digital Processing (DSP), Corfu, Greece, Jul. 6-8, 2011 (Jul. 6, 2011 to Jul. 8, 2011), pp. 1-6.
Michael Terrell et al.: "An Offline, Automatic, Mixing Method for Live Music, Incorporating Multiple Sources, Loudspeakers, and Room Effects", Computer Music Journal, 36:2, Massachusetts, United States of America, Summer 2012, pp. 37-54, Massachusetts Institute of Technology.
Dr. M. J. Terrell et al.: "Automatic Noise Gate Settings for Multi-track Drum Recordings", Proc. of the 12th Int. Conference on Digital Audio Effects (DAFx-09), Como, Italy, Sep. 1-4, 2009 (Sep. 1, 2009 to Sep. 4, 2009), pp. 1-8.
Dr. Michael Terrell et al.: "Optimising the Controls of a Homogeneous Loudspeaker Array", Audio Engineering Society, Convention Paper 8159, Presented at the AES 129th Convention, San Francisco, United States, Nov. 4-7, 2010 (Nov. 4, 2010 to Nov. 7, 2010), pp. 1-9.
Michael J. Terrell et al.: "Sounds not Signals: A Perceptual Audio Format", Audio Engineering Society, Convention e-Brief, Presented at the AES 132nd Convention, Budapest, Hungary, Apr. 26-29, 2012 (Apr. 26, 2012 to Apr. 29, 2012), pp. 1-5.
Perez-Gonzalez E. et al: "Automatic gain and fader control for live mixing", Applications of Signal Processing to Audio and Acoustics, 2009, WASPAA '09. IEEE Workshop on, IEEE, Piscataway, NJ. USA, Oct. 18, 2009 (Oct. 18, 2009), pp. 1-4, XP031575123, ISBN: 978-1-4244-3678-1.
Enrique Perez Gonzales et al: "Automatic Mixing: live downmixing stereo panner", Proc. of the 10th Int. Conference on Digital Audio Effects (DAFx-07), Sep. 10, 2007 (Sep. 10, 2007), XP055076731, Bordeaux, France, Retrieved from the Internet: URL:http://dafx.labri.fr/main/papers/p063. pdf [retrieved on Aug. 27, 2013].

* cited by examiner

SYSTEM AND METHOD FOR AUTONOMOUS MULTI-TRACK AUDIO PROCESSING

TECHNICAL FIELD

The following relates to systems and methods for processing audio data, for example multi-track audio processing in general, and autonomous multi-track audio production more specifically.

DESCRIPTION OF THE RELATED ART

In the field of both sound recording and live sound production it is common to process multiple tracks of audio simultaneously, each track corresponding to a separate audio signal. Many live and studio multi-track audio production tasks require dynamic user adjustment of various sound editing and manipulation parameters in order to combine multiple audio tracks into a high quality mixture. In a studio environment, such multi-track processing can be time consuming, even to a very skilled audio engineer. Furthermore, in a live environment, the real-time nature of the processing means that there is scope for error when determining how to edit and adjust parameters of the multiple tracks.

A need has therefore developed to assist engineers, particularly in the live-mixing environment, in minimising the difficulty of their work.

Some digital mixing desks have been developed that allow for particular loudness fader levels, or pan positions to be saved. As such, when a live audio engineer is dealing with multiple bands, or multiple arrangements of instruments, the engineer can pre-set the parameters, for example during a sound check, and thereby reduce some of the complexity of his or her job. However, there is still a need in such systems for the engineer to adjust these parameters during a performance due to fluctuations in track levels.

To date, no systems have been developed that attempt to assist the audio engineer with managing the control of multiple parameters for multiple tracks. There is therefore a need to provide a multi-track audio production system capable of overcoming at least some of the aforementioned problems.

SUMMARY

In one aspect, there is provided a method for mixing a plurality of audio signals within an audio mixing system. The method comprises receiving a plurality of audio signals, extracting at least one audio feature from each of the plurality of audio signals, determining, for each of the audio signals, an associated processing control function in accordance with a plurality of the extracted audio features, processing each audio signal in accordance with each associated processing control function, and outputting the plurality of processed audio signals.

The processing control functions may be determined in accordance with at least one processing rule. The at least one processing rule may be set prior to performing the mixing method. Furthermore, the at least one processing rule may comprise a plurality of rules, wherein at least one processing rule is provided for one audio signal of the audio signals, and at least one processing rule is provided for a plurality of audio signals of the audio signals.

The audio features may be extracted in parallel from the audio signals. Furthermore, the audio features may be extracted on a frame-by-frame basis. A plurality of the extracted audio features may be used to determine each processing control function derived from a frame. A plurality of the extracted audio features deriving from an audio signal of the audio signals may be filtered over a plurality of frames. The extracted features may be filtered using a moving average filter.

The audio features may include one or more of a loudness, a loudness range, a spectral masking, spectral centroid, a spatial masking, and a spectral balance. Audio characteristics such as stereo pan position and equalisation may be obtained from the audio features. Equalisation may be obtained from the spectral centroid and the spectral balance.

One of the audio features may be an audio signal loudness. Furthermore, the determining of each processing control function may further comprise determining a number of the audio signals that are currently active, summing the loudness of each of the currently active audio signals, dividing the result of the loudness summation by the number of currently active audio signals to determine an average loudness, and determining each processing control function in accordance with the average loudness.

The determining of each processing control function may further comprise determining frequency characteristics associated with each audio signal, setting the processing control function so that a stereo pan position of each audio signal is set in accordance with the determined frequency characteristics of the respective audio signal.

The stereo pan position of each audio signal may be set so that the higher the frequency characteristics of an audio signal, the further the audio signal is moved from a central pan position.

The determining of each processing control function may further comprise identifying a first audio signal and the frequency characteristics associated with the first audio signal, determining a second audio signal of the audio signals having associated frequency characteristics closest to the frequency characteristics associated with the first audio signal, and setting the processing control function so that a stereo pan position of one of the first and second audio signals is moved to an opposing stereo pan position compared to a stereo pan position of the other of the first and second audio signals.

In addition, the setting of the processing control function so that a stereo pan position of each audio signal is set in accordance with the determined frequency characteristics of the respective audio signal may further comprise combining the frequency characteristics of the audio signals, determining a stereo pan position of a centre point of the combined frequency characteristics, determining if the stereo pan position of the centre of the combined frequency characteristics is within predetermined limits, and adjusting the stereo pan position of one or more of the audio signals in order to bring the stereo pan position of the centre point of the combined frequency characteristics within the predetermined limits when the centre of the combined frequency characteristics is determined not to be within the predetermined limits.

The setting the processing control function so that a stereo pan position of each audio signal is set in accordance with the determined frequency characteristics of the respective audio signal may also further comprise combining the audio signals into a combined stereo audio signal, determining a peak magnitude of a left channel and a right channel of the combined stereo audio signal, determining if a ratio of the peak magnitude of the left and right channels of the combined stereo audio signal is within predetermined limits, and adjusting the stereo pan positions of one or more of the audio signals so that the ratio of the peak magnitude of the left and right channels of the combined stereo audio signal is within the predetermined limits when the ratio of the peak magnitude of the left and right channels of the combined stereo audio signal is determined not to be within the predetermined limits.

Furthermore, the determining of the processing control function may further comprise determining a maximum pan range of the audio signals, and setting the processing control function to adjust the stereo pan position of each audio signal to optimise the panning width.

The method may further comprise combining the plurality of processed audio signals to provide an output audio signal.

The method may be performed in real-time.

In accordance with another aspect, there is provided apparatus arranged to perform one or more of the methods disclosed herein.

In accordance with yet another aspect, there is provided a computer readable medium implementable on a computer and operable, in use, to perform one or more of the methods disclosed herein.

Embodiments described herein relate a method and corresponding apparatus for automatically producing mixed content from multi-track audio and may provide multiple inputs to and multiple outputs from the system.

Embodiments described herein may relate to extraction of features from a plurality of target audio tracks, and then analysing these features and the relationship between these features. Pre-determined constraints may dictate how the target tracks are modified based on the relationships of all target tracks and their features. Processing instructions may then be provided, in accordance with analysis of the tracks and the relationship between the tracks along with the pre-determined constraints. The plurality of audio tracks may then be processed in accordance with these instructions.

Embodiments described herein may also provide a system in which features of audio signals are extracted and controls for processing the audio signals are updated on a sample-by-sample basis. This minimises system latency. The extraction of features and updating of controls for processing may be performed as a side chain operation in real-time, which does not interrupt the signal flow.

Embodiments described herein may also be arranged to extract features of the audio signal(s) such as gain, loudness, loudness range, spectral masking, spatial masking, spectral balance, or spatial balance. These features and their relationship to each other may then be analysed. The system may adjust the content of the audio streams based on one or more optimisation criteria.

Embodiments described herein may also provide an autonomous processing system, whereby control values for each audio track are yielded simultaneously without the need for manual control.

Embodiments described herein may also provide multi-track audio production techniques which comprise a set of rules, which allow for automatic editing and combining of many parallel tracks of audio. Such techniques may be real-time operations.

Embodiments described herein may also use priority schemas to set relationships between different audio sources, and may also utilize perceptual and psychoacoustic phenomena when determining how to process the audio tracks.

Embodiments described herein may also relate to a multi-track mixing method comprising the steps of: inputting multiple audio signals to multiple tracks; extracting one or more features from each audio track; analysing the extracted features to determine the relationship between each audio signal; modifying the audio signal of two or more tracks according to a predetermined target model; and outputting one or more modified audio signal(s).

Embodiments described herein may also offer significant practical advantages by allowing autonomous control of a desired audio feature, such as loudness.

Embodiments described herein may also utilize any signal feature, not just signal level and can do this with many tracks simultaneously.

Embodiments described herein may be implemented in software. Other embodiments are implemented in hardware. In particular, some embodiments may be implemented within a solid-state device.

It should be appreciated that while spectral flux, crest factor, spectral centroid, and spectral spread are known features of audio signals, such features have not previously been recognised as being suitable for use in audio mixing as recognized in the present application.

BRIEF DESCRIPTION OF THE DRAWINGS

Embodiments will now be described by way of example only with reference to the appended drawings wherein.

DETAILED DESCRIPTION

It will be appreciated that throughout the following description and accompanying drawings, like reference numerals refer to like parts.

It will also be appreciated that for simplicity and clarity of illustration, where considered appropriate, reference numerals may be repeated among the figures to indicate corresponding or analogous elements. In addition, numerous specific details are set forth in order to provide a thorough understanding of the examples described herein. However, it will be understood by those of ordinary skill in the art that the examples described herein may be practiced without these specific details. In other instances, well-known methods, procedures and components have not been described in detail so as not to obscure the examples described herein. Also, the description is not to be considered as limiting the scope of the examples described herein.

It will also be appreciated that the examples and corresponding diagrams used herein are for illustrative purposes only. Different configurations and terminology can be used without departing from the principles expressed herein. For instance, components and modules can be added, deleted, modified, or arranged with differing connections without departing from these principles.

A processor 100 used in a multi-track mixing system 1000 (see also FIG. 4), which is arranged to automatically produce mixed audio content from multi-track audio content shall now be described with reference to FIG. 1.

Figure 1:
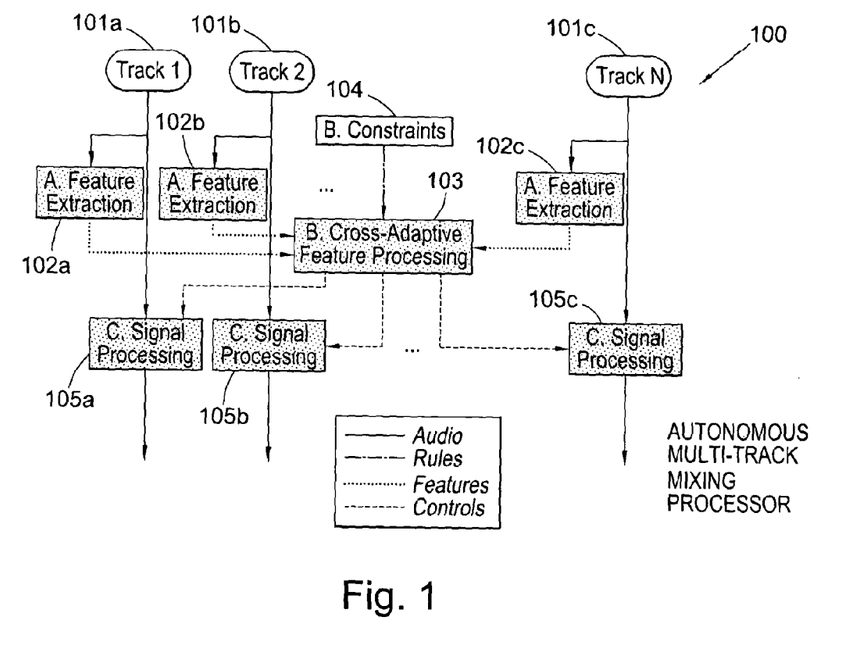
FIG. 1 is a block diagram illustrating the functional components of a multi-track mixing processor.

The processor 100 shown in FIG. 1 is arranged to perform the automated audio mixing by carrying out the following steps:

Receive input signals: digital audio signals from multiple tracks are received at an input of the system and routed to multiple parallel signal processing channels of the system;

Feature extraction: each of the digital audio signals is analysed and specific features of each of the digital audio signals are extracted;

Feature Analysis: the extracted features and the relationship between extracted features of different signals are analysed and, in accordance with one or more processing control rules, the processing required for each track is determined;

Signal Processing: The audio signals are then processed in accordance with the feature analysis; and Output processed signals: the processed signals are then output as modified digital audio signals corresponding to each track.

The automated mixing process, including each of the above-mentioned steps, shall now be described in greater detail making reference to the figures.

An input of the processor 100 is arranged to receive a plurality of stereo digital audio signals 101, in this example first, second, and third stereo audio signals 101a, 101b, 101c. Each stereo audio signal 101 corresponds to an audio track to be processed, and has a left channel and a right channel. The input of the processor 100 receives each track as a separate audio signal 101. The processor 100 is arranged to accept any number of input audio tracks; the number of tracks only being limited by the processing capability of the multi-track mixing system 1000 and the requirements of the audio to be output.

Figure 3:
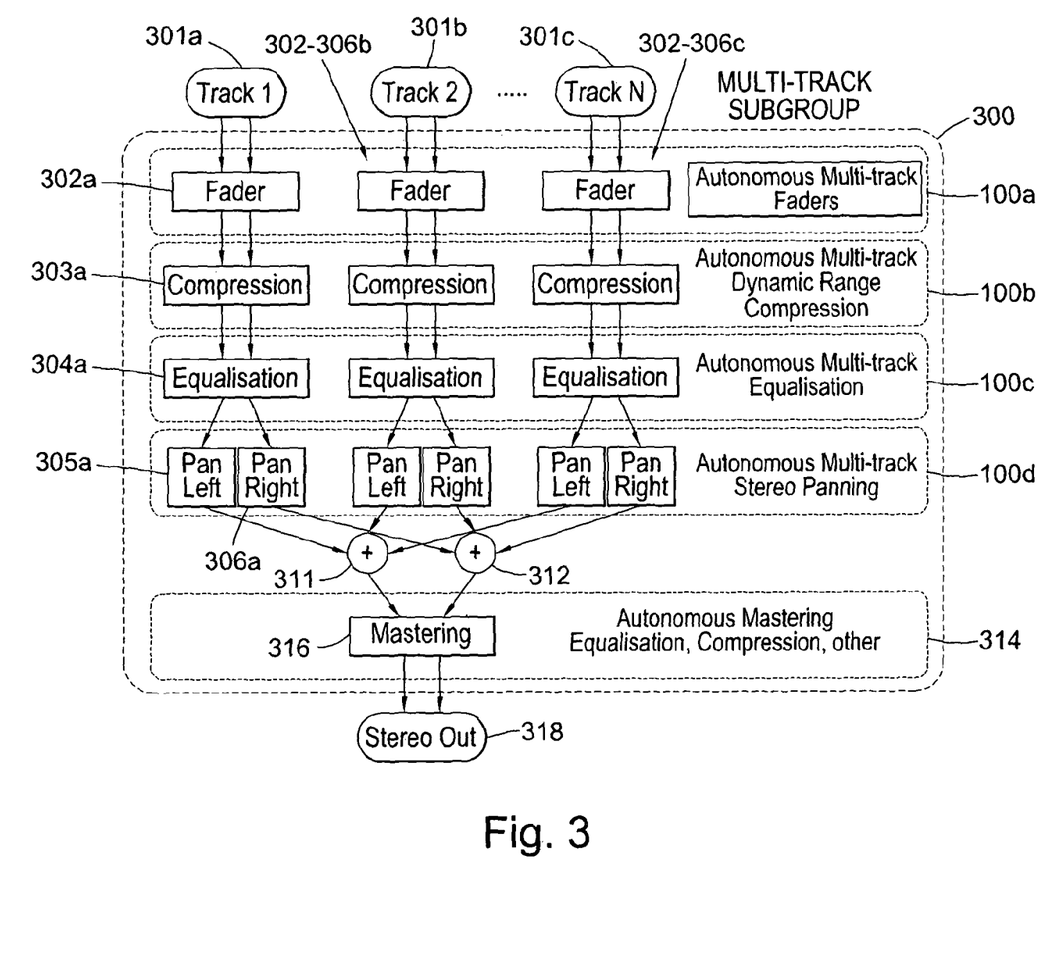
FIG. 3 is a block diagram illustrating the functional components of a multi-track subgroup for a multi-track mixing system comprising a number of multi-track mixing processors and single-track mastering processors.
Figure 4:
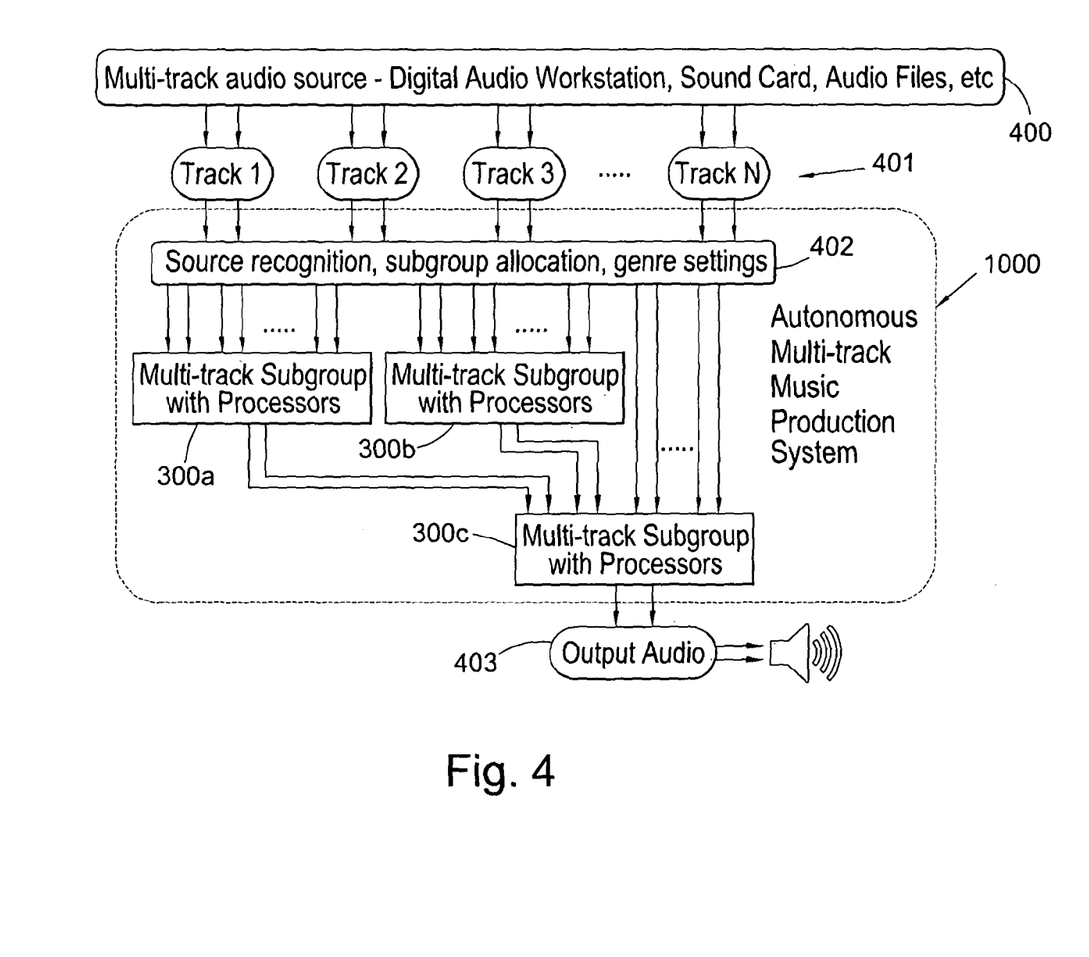
FIG. 4 is a block diagram illustrating the functional components of a multi-track mixing system comprising a number of multi-track subgroups.

It can be appreciated that the multi-track mixing system 1000 may also use sub-grouping to achieve an optimal mix of the audio signals 101, as shown in FIGS. 3 and 4, described below. Individual groups of tracks can be assigned to sub-groups, inside which mixing and mastering processors can be placed. Sub-groups can be linked together so that the mix-down or individual tracks from one subgroup act as an input to another. Pre-sets can be used to apply specific settings to sub-groups, e.g., for genre-specific or instrument-specific mixes.

The designation of sub-groups can be achieved automatically using source recognition, such as vocal and percussion detection techniques. These detection techniques are based on machine learning algorithms on numerous low and high-level extracted audio features, and incoming tracks are analyzed in real time and can be judged by their relation to the results of off-line machine learning analysis. Another feature of sub-grouping is the sharing of extracted features between processors, to prevent repeated calculation of extracted features and thus improve efficiency.

In the example shown in FIG. 1, the received audio data is processed in real-time. Such real-time processing is particularly useful when the received signals are real-time signals recorded live or deriving from streamed content. In such an example, feature extraction 102 is performed on the streaming audio in real-time as the audio is received. The features of the audio to be extracted includes features or characteristics of the audio signal such as gain loudness, loudness range, spectral masking, spatial masking, spectral balance, spatial balance, and others, as will be discussed in more detail below.

The received audio signals are passed into a parallel processing operation or "side-chain" for the extraction and analysis of audio features. A plurality of feature extraction modules 102a, 102b, 102c provide such parallel feature extraction as shown in FIG. 1.

Instantaneous feature values are extracted by the feature extraction modules 102a, 102b, 102c on a sample-by-sample or frame-by-frame basis, depending on implementation. In the latter case, frame size is as low as required to ensure real-time operation with minimal latency. Accumulative averaging is applied to features to implement real-time feature estimation, the rate of which adjusts according to frame size and sample rate, which is carried out closely following the latest update of the feature value.

The extracted stream of data indicative of the certain features of an audio signal is smoothed over time using an exponential moving average filter with associated time attack and release constants, as shown by equation 1 below:

$$F_m(n+1) = (1-\alpha)F'_m(n+1) + \alpha F_m(n) \qquad \text{(Equation 1)}$$

In Equation 1, $F'_m$ represents an instantaneous estimation of a feature from the $m^{th}$ track, F represents the smoothed feature estimation, n is the current sample being processed, and $\alpha$ is a constant between 0 and 1 that determines the weighting of recent samples in the smoothed feature estimation. Alpha values adjust according to frame size/sample rate ratio to ensure a non-varying filter response.

The cross-adaptive multi-track feature processing module 103, shown in FIG. 1, receives each of the features extracted by each of the feature extraction modules 102a, 102b, 102c. The cross-adaptive processing module determines processing control functions which dictate the processing operations to be applied to each of the tracks. The processing control functions are also determined based on pre-determined constraints or rules, along with the extracted features. The predetermined constraints may be set by a user prior to starting the mixing process and stored in a constraints module 104. The processing rules may set certain required relationships between tracks, or upper/lower limits for specific features. Constraints include, but are not limited to, the following:

For autonomous multi-track faders, all active sources tend towards equal perceived loudness;

For autonomous multi-track stereo positioning, all tracks are positioned such that spatial and spectral balance is maintained;

For autonomous multi-track dynamic range compression, compressors are applied on each track such that variation in loudness range of active sources is minimised; and For autonomous multi-track equalization, filters are applied on each track such that spectral bandwidth of sources does not overlap.

For autonomous delay and polarity correction, delays can be added to each track to synchronize each track to a common reference.

The cross-adaptive feature processing block 103 includes a feedback operation to ensure convergence towards the desired features in the output. That is, the controls produced by the cross-adaptive feature processing block may be analysed before they are applied. If they fail to produce the desired result within a given tolerance, then the control values are adjusted before they are applied.

The processing control functions take the form of time varying filters, such as gains, delays, and infinite impulse response filters. More specifically, a control vector may be utilized, which is a weighted sum of previous control vectors and a function of the extracted features. In the case of loudness faders, multi-track processing is used to derive a decibel level control for each track. The result of this processing is then converted back to the linear domain, and applied as a time varying gain to each track, as discussed below. Similarly, in the case of autonomous stereo positioning, multi-track processing is used to derive a panning position for each track, which is then applied as two gains, producing a left and a right output for stereo positioning.

In the case of autonomous delay and polarity correction, the delays between all tracks and a reference are analyzed, and an artificial delay introduced to synchronize the audio.

Once the above-mentioned control functions have been determined they are used to process each of the tracks in the parallel signal processing modules 105a, 105b, 105c. Each track is then output by the respective processing block 105a, 105b, 105c as a separate audio signal which has been processed in accordance with the controls determined by the cross-adaptive processing module 103. Each processed signal is then combined by a summation process into a single audio output in the output module 106. The output can be of any suitable format, but in this example, is a stereo output.

The three main aspects of audio signals to be mixed are: the relative loudness levels of each track on a frame-by-frame basis; the relative loudness of the audio signal over a period of time; and the stereo panning of each track (for mixing of stereo audio signals). Hence, the automated feature extraction and processing for each of these aspects of an audio signal shall now be considered in detail.

Figure 2:
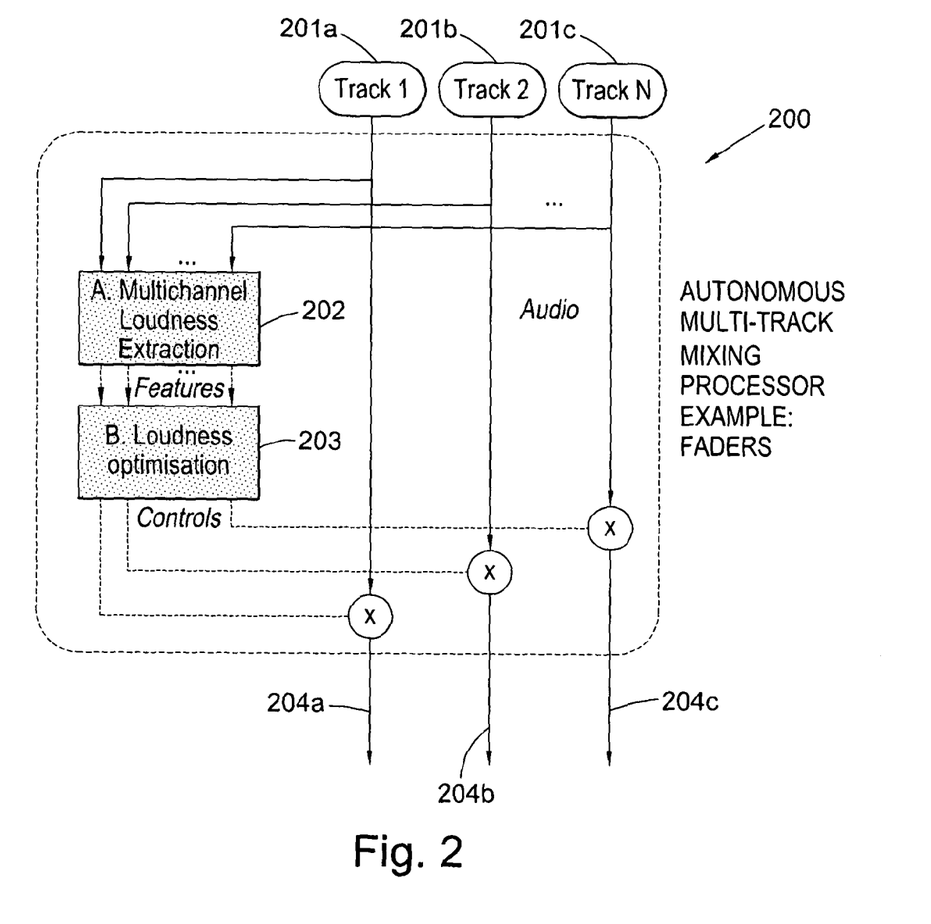
FIG. 2 is a block diagram illustrating the functional components of a multi-track mixing processor adapted to perform loudness processing for a multi-track mixing system.

FIG. 2 shows a multi-track mixing processor 200 that is configured to extract loudness and loudness range to allow for independent control of the relative loudness levels of multiple audio tracks to implement a fader as an example use case. In the example shown in FIG. 2, the feature extraction corresponds to loudness extraction and the cross adaptive processing corresponds to loudness optimization.

As shown in FIG. 2, audio signals corresponding to multiple tracks 201a, 201b, 201c of the multi-track mixing system 1000 have information relating to their loudness extracted by a multi-channel loudness extraction module 202 at each sample of frame. The multi-channel loudness extraction module 202 takes the perceptual loudness of all tracks into consideration when determining the associated loudness. A loudness optimization module 203 then determines the control functions to be applied to one or more of the tracks, as appropriate, in accordance with the perceptual loudness determination. The tracks to have their loudness altered are then altered by the respective processing modules 204a, 204b, and 204c, e.g., by having a gain applied to increase or decrease a signal level.

As discussed below, the system 1000 is configured to include a modification of the standard loudness model, ITU-R BS. 1770-2, to enhance its use in the system 1000.

Filter coefficients are mapped to continuous time values, and then remapped to a sample rate of the multi-track audio. This allows the loudness measure to work with any sample rate.

While the loudness is extracted at each sample or frame in accordance with the EBU R 128 standard, the standard extraction technique is customised for smooth real-time loudness estimation. An overlapping window approach, as in EBU R 128 and in the gating of ITU-R BS. 1770-2, is not used for estimation of loudness. Instead, the exponential moving average filter of Equation 1 is applied, with a time constant set equal to the 3000 ms window length specified in EBU R 128 for gating, i.e., detection of an active signal, and for short-term loudness estimation.

During the feature extraction 102, the processor 100 is arranged to distinguish between silences and wanted audio and is also able to accommodate for silent portions within the audio, with a binary state of activity for each track determined by the current loudness value immediately after its calculation. The silence threshold can be estimated based on relative levels in the audio stream. Adaptive thresholds are used to gate out any periods of silence or background noise. In particular, two independent gates are used for silence detection, a gate for determining when silence begins, set at −30 LUFS (Loudness Units Full Scale) and −25 LUFS for determining when silence ends. Use of two gates in this way prevents random noise resulting in fluctuating loudness estimation, and hence prevents over adjustment of the control vector in the processing stage. This silence processing is carried out as part of the feature extraction block 102, and included in loudness estimation to ensure that it does not interfere with signal flow through the system. Thus, computationally intensive operations can be performed without any interference with the real-time signal flow.

Information relating to masking between tracks is also obtained for determination of equalization curves, based on a novel, low computational complexity, measurement of multi-track masking of frequency content in the spectral domain derived from a measure of overlapping spectral spread of each track. Spectral spread and spectral centroid are measured on a frame by frame basis for each track. Thus a bandwidth is identified, with a mid-point frequency at the spectral centroid and covering a frequency range given by the spectral spread. The amount of overlap in bandwidth between sources is used as an indicator of masking.

Spectral spread is also to determine the maximum and minimum frequencies to cut using low and high pass filters, in order to isolate sound sources to a certain bandwidth representing their main frequency range. Shelving and notch filters are then used to deal with areas where there is prominent overlap. The resulting spectrum after equalization is compared with a target spectrum, and a feedback mechanism applied as a control mechanism.

To reduce the effect of sibilant sounds the overall magnitude of the spectral content over a high-mid to high-frequency range, typically between 5 and 10 kHz, is analyzed for each track. When the magnitude crosses a threshold a notch filter centred at the median frequency bin is applied. The processing control functions that are developed from the extracted information for the loudness adjustment processing also take into consideration a psychoacoustic model, which has been validated by subjective evaluation and shown to improve the perceived quality of the resultant mixed audio. The psychoacoustic model includes: biquadratic Infinite Impulse Response (IIR) filters which are applied to the audio signals that correspond to the perceived loudness of each signal at different frequencies; a shelving 'pre-filter' which models the acoustic effect of the head, i.e. a head related transfer function (HRTF); and a high pass 'RLB filter' to model the response of the human ear.

In addition to ensuring a good balance of the relative loudness of each track of a multi-track audio stream at any instant in time, it is also important to monitor and adjust the relative loudness of each track, and the mix as a whole, over time. Without such monitoring and adjustment unnatural or unwanted jumps in loudness may occur.

Loudness range is therefore extracted for production of multi-track dynamic range compression. The loudness range extraction means is adapted from the EBU R 128 standard and is customised for smooth real-time estimation. Furthermore, the spectral flux and crest factor are extracted for estimation of dynamic range compression parameters.

The system 1000 utilises these extracted features to provide multi-track dynamic loudness processing as follows.

A count of currently active tracks is maintained, as determined by a noise gate. That is, a noise gate is used to determine which tracks have a signal below a threshold loudness indicative of an inactive track. The controls applied to inactive tracks are kept constant until the tracks becoming active again. Hence, smoothing of a track's variables begins only when it first becomes active to prevent a fade effect. The total absolute loudness of all tracks is then summed and divided by the track count to produce a dynamic target loudness, or average loudness, that allows for intended fluctuations in the overall mix signal level. An exponential moving average filter is used to provide a smoothly varying value. Controls (in the decibel domain) are then calculated as a ratio of the track loudness to the average loudness. As with other variables, the decibel level control values are smoothed using an EMA filter. Lead track(s), typically vocals, can be selected for a gain boost to ride over the rest of the mix.

The Delay and Polarity correction algorithm utilized in the present system 100 can be one that is based on a Generalized Cross Correlation with Phase Transform (GCC-PHAT) approach, using an Fast Fourier Transform (FFT) to convert both the unsynchronized audio stream and the reference audio into a frequency domain representation. The two FFT outputs are combined through a GCC, the result being normalized using the Phase Transform and converted into a histogram using an Inverse FFT.

The index of the maximum absolute value of the histogram is interpreted as the sample delay. If the value is negative, the sources are deemed to be out of phase and one is inverted before summing. The efficiency of the algorithm is improved by using lower FFT sizes to minimize calculation, provided the delay is small enough. The algorithm can automatically reduce window size once the approximate delay is known to reduce the central processing unit (CPU) load.

The extraction and processing of the stereo positioning of the multi-track audio signals shall now be considered in detail.

The stereo positioning functionality of the multi-track audio processing system employs the same loudness and noise gate processing used for determining active tracks so that inactive tracks bypass the processing and the track's parameters therefore remain constant. The stereo pan processing then works as follows.

Spectral centroid information is extracted for determination of the stereo positioning of a signal. This spectral centroid defines a panning factor associated with an audio signal, set by a ratio against the maximum spectral centroid found over all channels, with the result that higher frequencies are progressively panned further from the centre of the panning space. The spectral centroid of each active track is calculated using a Fast Fourier Transform (FFT). Initially, as a track enters for the first time, a determination is made of which of the other tracks has the closest spectral centroid. Then each couple of tracks related by the closeness of their spectral centroid are then set to opposing left or right channels of the stereo output.

Hence, this operation prevents tracks from crossing over the 0.5 centre point. If this process results in a poor distribution of tracks over the left and right channels then the system will perform this operation again until an acceptable distribution is provided. As source distribution problems typically occur on the rare occasion that multiple tracks enter the mix at exactly the same time, repeating the operation after the tracks have entered ensures a better source distribution. As a fail-safe measure the program will only allow a small number of attempts before the distribution is fixed.

The system 1000 is also arranged to determine a maximum spectral centroid range found over both channels of all tracks. A maximum spectral centroid parameter indicative of this range is then stored in a memory of or associated with the system 1000 and updated as and when this range changes. The panning factors of each audio track can then be adjusted to further spread the tracks across the left and right channels so that the full panning space is utilised even when the full frequency spectrum is not. The extent of the panning width can therefore be controlled by the user or automatically in order to maximise the use of the available spatial audio width.

Spectral and spatial balance are also analysed at the output of the stereo mix in order improve the quality of the audio output.

For spectral balance, FFTs of the left and right output channels are split into five frequency bands, and the magnitude of each band's frequency bins are cumulatively summed per channel. The arctangent of the ratio between the left and right summation produces a spectral balance angle for each band. If the spectral balance angle of a mix is below 0.45 or above 0.55, then pan locations of each track are adjusted to push the spectral balance angle back towards the 0.5 centre point. The adjustment of pan locations is performed with a ratio so that tracks with spectral centroid locations closest to the centre frequency of each band are moved the furthest, and those tracks outside a certain bandwidth (determined by a fixed Q-factor of 0.3 from the centre frequency) are not moved at all.

Spatial balance is improved by analyzing the ratio of the peak magnitude of output left and right channels, and moving all sources indiscriminately by a small factor, provisionally 0.02, if the ratio of the peak magnitude of output left and right channels is outside the same allowed tolerance as described for the spectral balance above (below 0.45 or above 0.55). Typically, however, the adjustment of pan locations for spectral balance ensures the overall spatial balance is kept within the allowed tolerance.

Combined, the system 1000 continuously adapts to produce a balanced mix, with the intent to maximize panning as far as possible up to the limits determined by each track's spectral centroid. All parameters, including the final pan controls are passed through EMA filters to ensure that they vary smoothly. Lead track(s), typically vocals, can be selected to bypass the panning algorithm and be fixed in the centre of the mix.

FIG. 3 illustrates a multi-track subgroup 300 configuration which performs the processing and mixing as a series operation for autonomous, real-time, low latency multi-track audio production.

Each track 301a, 301b, 301c is received by the multi-track subgroup 300 and firstly undergoes loudness processing in the loudness processing module 302. A loudness processor 302a, 302b, 302c is associated with each individual track and performs the actual processing of the loudness characteristics of the associated track in a first multi-track mixing processor 100a.

The tracks 301a, 301b, 301c are then processed by the compression module 303 using compression processors 303a, 303b, 303c associated with each track in a second multi-track mixing processor 100b, and then by an EQ module 304 and the associated EQ processors 304a, 304b, 304c to apply a sequence of filters to alter the frequency content of a track in a third multi-track mixing processor 100c. The processed audio signals corresponding to each of the tracks 301a, 301b, 301c are then processed by the stereo panning module 305 and each of the respective left and right stereo panning processors 305a/306a, 305b/306b, 305c/306c in a fourth multi-track mixing processor 100d. The left and right signals are then combined at 311 and 312 respectively and are processed by a mastering module 316 in an autonomous mastering processor 314 to be output at 318 by the system 300.

FIG. 4 illustrates an example of an autonomous multi-track mixing system 1000, e.g. used as a music production system. The system 1000 includes inputs for a number of tracks 401 that are provided by an audio source 400. The system 1000 performs source recognition, subgroup allocation and genre settings in the control block at 402. Source recognition uses machine learning and feature extraction methods to automatically determine the audio source type or instrument. This information can then be used to divide the tracks into subgroups, for example a vocal or percussion subgroup, to form the audio production system. Subgroup allocation and routing can also be controlled externally by the user, and will ultimately feed into a final 'main' subgroup that outputs the finished stereo mix. Genre settings are also determined by source detection or by user control. This allows each subgroup and the processors contained within to have different parameter settings and pre-sets, depending on the choice or detection of genre. In the typical example shown in FIG. 4, the signals are separated into multiple multi-track subgroups 300a, 300b, and 300c, which output the final mixed audio at 403.

Although a particular example system 1000 is shown in FIG. 4, it can be appreciated that various system configurations can be achieved using the principles described above, e.g. by adapting the structure in FIG. 1 in multiple flexible ways to create processors 100 (e.g. faders, compression, etc.) and subgroup placements that adapt to a particular application. For example, the stages shown in FIG. 3 can be reconfigured to be in different orders, quantities and routing. As such, it can be appreciated that the examples shown herein are illustrative only.

The present invention also includes novel automatic mastering techniques, to perform the final processing on the mixed-down audio output after the multi-track processing, i.e. the output of system 100, or the mixed-down output of the subgroups.

The mastering equalization algorithm preferably adapts the overall spectral shape of the mix by analyzing and manipulating a set of time-varying parametric EQ filters 304 to create an optimal overall frequency spectrum. Target curves are pre-calculated, using data obtained by the spectral distribution analysis of mastered recordings, and the system dynamically adapts with no human interaction to achieve a consistent mastered output spectrum.

The magnitude spectrum of a short time FFT is calculated, provided the signal has sufficient energy to pass a hysteresis noise gate. Bands are determined with upper and lower cut-off frequencies, and the normalized sum of the magnitude spectrum within each frequency band is calculated. The algorithm allows for any number of frequency bands to be designated. A mean normalized average magnitude value over all bands is used as the preliminary target. Weighted target magnitude values for each band are determined by the choice of preset.

An IIR Peaking equalizer filter is allocated at the center frequency per band, with a fixed Q for an optimally flat response. The gain applied to the filter is dynamically adjusted as a ratio of the normalized band value and the target value.

A second embodiment uses the Yule-Walker approach to design IIR filters to fit the desired target frequency response. The target equalization curve is divided by the magnitude spectrum of the input audio to determine the desired transfer function. Smoothing is then performed to iron out rapid variations in the spectrum, and the Yule-Walker approach is used to compute the filter coefficients of a high order filter.

The mastering compressor algorithm uses intelligent automation of dynamic range compressor parameters. Appropriate time-varying compression is applied to reduce the dynamic range of the master audio output.

Threshold is automated by the analysis of the root mean squared value of the input signal. Knee width is directly proportional to the threshold. Attack and Release times are automated based on crest factor.

There is also functionality to incorporate all parameters into a single control to 'compress by a given number of decibels'. This uses an estimate of the average amount of compression on a signal as $c \cdot T(1-1/R)$, where c is a weighting parameter with default value 0.5, T is the threshold and R is the ratio.

The limiter threshold is set as 2 dB above the compressor threshold, with all other parameters fixed. Make up gain is applied last, calculated as a ratio between signal energy in and energy out.

A low/high pass doubler may also be used to enhance the midrange of the frequency spectrum. This works by duplicating the output audio and applying a low pass filter to one and an equivalent high pass filter to the other. The audio sources are then recombined.

A channel balancer monitors the loudness of each channel of the mix-down using a perceptual loudness measure, and applies a time-varying gain value to match each channel to be of an average equal loudness.

The various different systems, operations, and methods described above may be implemented in hardware or by a computer program. When implemented by a computer program a computer could be provided having a memory to store the computer program, and a processor to implement the computer program. The computer program may include computer code arranged to instruct a computer to perform the functions of one or more of the various methods described above. It will be appreciated that any module or component exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the system 100, any component of or related to the system 100, etc., or accessible or connectable thereto. Any application or module herein described may be implemented using computer readable/executable instructions that may be stored or otherwise held by such computer readable media.

An apparatus such as a computer may be configured in accordance with such computer code to perform one or more processes in accordance with the various methods discussed above.

The audio input signals may be received from either a multi-track computer soundcard or from stored tracks on a computer. The output content may be produced as stored audio, or outputted directly to the soundcard where it may immediately be played out as analogue sound through loudspeakers.

It will be appreciated that input audio signal may also be a continuous digital data stream from which the different audio signals are extracted. Furthermore, in alternative embodiments the system 100 is arranged to receive one or more analogue audio signals and one or more digital-to-analogue converters (DAC) of the system convert the analogue signal(s) to digital signal(s).

While the above-described embodiments relate to real-time processing it will be appreciated that other embodiments may be implemented for to non-real-time processing according to the same principles. In such embodiments, the received audio data may be stored in a memory of the system, or an external memory associated with the system, and then processed at any time.

While the embodiments above relate to stereo audio signals, it will be appreciated that other embodiments may be implemented for mixing of monaural audio signals.

The steps or operations in the flow charts and diagrams described herein are just for example. There may be many variations to these steps or operations without departing from the principles discussed above. For instance, the steps may be performed in a differing order, or steps may be added, deleted, or modified.

Although the above principles have been described with reference to certain specific examples, various modifications thereof will be apparent to those skilled in the art as outlined in the appended claims.

The invention claimed is:

1. A method for automatic audio mixing, the method comprising:
   receiving at least one audio track;
   extracting at least one feature from each of the at least one audio track;
   enabling a configuration for each of at least one processing control function for the at least one audio track to be controlled;
   processing each audio track using the at least one processing control function configured for that track, in accordance with the at least one extracted feature; and
   outputting at least one processed audio track; and
   wherein the at least one processing control function is determined in accordance with a plurality of processing rules, wherein at least one processing rule is provided for one audio track, and at least one processing rule is provided for a plurality of audio tracks.

2. The method of claim 1, further comprising performing a feedback operation to compare at least one output produced to a desired result prior to said outputting the at least one processed audio track.

3. The method of claim 1, further comprising analyzing a relationship between at least one pair of extracted features from at least one track, and processing each audio track using the at least one processing control function in accordance with the at least one extracted feature and the relationship.

4. The method of claim 1, wherein configuring the at least one processing function comprises establishing at least one subgroup of audio tracks having a particular configuration of the at least one processing control function.

5. The method of claim 4, wherein a plurality of sub-groups are configured, at least a pair of the plurality of sub-groups being configured to communicate with each other.

6. The method of claim 1, the configuration being made according to at least one of source recognition of at least one audio track, genre settings associated with the content of the at least one audio track, and subgroup allocation of audio tracks having particular configurations of the at least one processing control function.

7. The method of claim 1, further comprising performing a mastering function to a mix comprising the at least one processed audio track.

8. The method of claim 7 wherein the mastering function adapts an overall spectral shape of the mix to generate an optimized overall frequency spectrum.

9. The method of claim 8, wherein the overall spectral shape is adapted by analyzing and manipulating a set of time-varying equalization filters.

10. The method of claim 8, wherein the mastering function comprises summing a magnitude spectrum within each of a plurality of frequency bands.

11. The method of claim 8, wherein the mastering function comprises applying an equalizer filter allocated at a centre frequency per frequency band.

12. The method of claim 1, wherein a control block receives the at least one audio track and adapts the at least one processing control function to configure an audio mixing system.

13. The method of claim 1, wherein the at least one processing rule is set prior to performing the method.

14. The method of claim 1, wherein the audio features are extracted in parallel from the at least one audio track.

15. The method of claim 1, wherein the audio features are extracted on a frame-by-frame basis.

16. The method of claim 15, wherein a plurality of the extracted audio features is used to determine each processing control function derived from a frame.

17. The method of claim 15, wherein a plurality of the extracted audio features derived from an audio track is filtered over a plurality of frames.

18. The method of claim 1, wherein the audio features include one or more of a loudness, a loudness range, a spectral masking, spectral centroid, a spatial masking, a spectral balance, and crest factor.

19. The method of claim 1, wherein one of the audio features is an audio signal loudness, and the determining of each processing control function further comprises:
   determining a number of the audio tracks that are currently active;
   summing the loudness of each of the currently active audio tracks;
   dividing the result of the loudness summation by the number of currently active audio tracks to determine an average loudness; and
   determining each processing control function in accordance with the average loudness.

20. The method of claim 1, wherein determining of each processing control function comprises:

determining frequency characteristics associated with each audio track; and setting the processing control function so that a stereo pan position of each audio track is set in accordance with the determined frequency characteristics of the respective audio track.

21. The method of claim 20, wherein the stereo pan position of each audio track is set so that the higher the frequency characteristics of an audio track, the further the audio track is moved from a central pan position.

22. The method of claim 20, wherein the determining of each processing control function further comprises:
   identifying a first audio track and the frequency characteristics associated with the first audio track;
   determining a second audio track having associated frequency characteristics closest to the frequency characteristics associated with the first audio track; and
   setting the processing control function so that a stereo pan position of one of the first and second audio tracks is moved to an opposing stereo pan position compared to a stereo pan position of the other of the first and second audio tracks.

23. The method of claim 20, wherein the setting of the processing control function so that a stereo pan position of each audio track is set in accordance with the determined frequency characteristics of the respective audio track further comprises performing a spectral balance by:
   combining the frequency characteristics of the audio tracks;
   determining a stereo pan position of a centre point of the combined frequency characteristics;
   determining if the stereo pan position of the centre of the combined frequency characteristics is within predetermined limits; and
   adjusting the stereo pan position of one or more of the audio tracks in order to bring the stereo pan position of the centre point of the combined frequency characteristics within the predetermined limits when the centre of the combined frequency characteristics is determined not to be within the predetermined limits.

24. The method of claim 20, wherein the setting the processing control function so that a stereo pan position of each audio track is set in accordance with the determined frequency characteristics of the respective audio track further comprises performing a spatial balance by:
   combining the audio tracks into a combined stereo audio signal;
   determining a peak magnitude of a left channel and a right channel of the combined stereo audio signal;
   determining if a ratio of the peak magnitude of the left and right channels of the combined stereo audio signal is within predetermined limits; and
   adjusting the stereo pan positions of one or more of the audio tracks so that the ratio of the peak magnitude of the left and right channels of the combined stereo audio signal is within the predetermined limits when the ratio of the peak magnitude of the left and right channels of the combined stereo audio signal is determined not to be within the predetermined limits.

25. The method of claim 20 wherein the determining of the processing control function further comprises:
   determining a maximum pan range of the audio tracks; and
   setting the processing control function to adjust the stereo pan position of each audio track to optimise the panning width.

26. The method of claim 1, further comprising combining the at least one processed audio track to provide an output audio signal.

27. The method of claim 1, wherein the method is performed in real-time.

28. The method of claim 1, wherein at least one parameter for the at least one processing control function is dynamic.

29. An apparatus comprising at least one processor, at least one memory, and computer executable instructions executable by the at least one processor to perform the method of claim 1.

30. A computer readable medium device including computer executable components for performing the method of claim 1.

* * * * *